(12) United States Patent
Cern

(10) Patent No.: US 6,844,810 B2
(45) Date of Patent: Jan. 18, 2005

(54) ARRANGEMENT OF A DATA COUPLER FOR POWER LINE COMMUNICATIONS

(75) Inventor: Yehuda Cern, Brookline, MA (US)

(73) Assignee: Ambient Corporation, Newton, MA (US)

( * ) Notice: Subject to any disclaimer, the term of this patent is extended or adjusted under 35 U.S.C. 154(b) by 0 days.

(21) Appl. No.: 10/688,154

(22) Filed: Oct. 17, 2003

(65) Prior Publication Data

US 2004/0090284 A1 May 13, 2004

Related U.S. Application Data

(60) Provisional application No. 60/419,174, filed on Oct. 17, 2002.

(51) Int. Cl.[7] .......................... H04M 11/04; H01P 1/32; H01F 38/20
(52) U.S. Cl. ............................ 340/310.07; 340/310.01; 340/310.05; 333/24 R; 333/24 C; 336/174
(58) Field of Search .................. 340/310.01, 310.02, 340/310.03, 310.04, 310.05, 310.06, 310.07, 310.08; 333/24 R, 24 C; 336/174

(56) References Cited

U.S. PATENT DOCUMENTS

| | | | | |
|---|---|---|---|---|
| 4,142,178 A | * | 2/1979 | Whyte et al. | 340/310.06 |
| 5,684,450 A | * | 11/1997 | Brown | 340/310.02 |
| 5,717,685 A | * | 2/1998 | Abraham | 340/310.01 |
| 5,856,776 A | * | 1/1999 | Armstrong et al. | 340/310.01 |

* cited by examiner

Primary Examiner—Donnie L. Crosland
(74) Attorney, Agent, or Firm—Ohlandt, Greeley, Ruggiero & Perle, LLP

(57) ABSTRACT

There is provided an arrangement of components for coupling data between a power line and a communication device. The arrangement includes an inductive coupler that employs a power line conductor as a primary winding, a capacitor connected across a secondary winding of the inductive coupler for creating a resonant circuit with the secondary winding at a frequency within a desired frequency band, and an impedance matching transformer for connecting a communications device to the secondary winding. The resonant circuit has a loaded Q consistent with the desired bandwidth. An alternative arrangement includes a capacitor in series with a conductive cylinder between the power line and the communication device, where the capacitor is for blocking power line voltage while passing a signal between the power line and the communication device, and the conductive cylinder appears as a low inductance to the signal.

6 Claims, 4 Drawing Sheets

ARRANGEMENT OF A DATA COUPLER FOR POWER LINE COMMUNICATIONS

CROSS-REFERENCE TO RELATED APPLICATIONS

The present application is claiming priority of U.S. Provisional Patent Application Ser. No. 60/419,174, filed on Oct. 17, 2002, the content of which is herein incorporated by reference.

BACKGROUND OF THE INVENTION

1. Field of the Invention

The present invention relates to power line communications, and more particularly, to configurations of data couplers for power line communications.

2. Description of the Related Art

A data coupler for power line communications couples a data signal between the power line and a communication device such as a modem. The data coupler exhibits a cutoff frequency. Below the cutoff frequency, coupling attenuation between the power line and the communication device becomes excessive. The data coupler may be either an inductive coupler or a capacitive coupler.

An inductive coupler for a power line should ideally have a magnetization inductance with an impedance that is large as compared to an impedance of the communication device. As the magnetization inductance is in shunt with a signal and inductively loads the signal, a low magnetization inductance is undesirable.

A capacitive coupler may be efficient for use on a power line, especially a low voltage line.

FIG. 1 is a schematic of a prior art capacitive coupler as may be used to couple a power line modem to a secondary power line. A power line 400, nominally neutral, is connected to a shield terminal of a coax connector 420. A power line 405, nominally an energized phase line, is connected to a center conductor contact of connector 420 via a fuse 415 and a capacitor 410. A modem 435 is connected, via a cable 430 and a connector 425, to connector 420. The capacitive coupler thus couples high frequency signals between modem 435 and power lines 400 and 405.

The value of capacitor 410 is several nanofarads, large enough to have negligible reactance at signal frequency and small enough to have a large reactance at power frequency.

A ceramic capacitor with an appropriate dielectric may be used in such a coupler and provides a low impedance to signal frequencies in the MHz range. However, a lead connecting such a capacitor to the power line may be relatively long, and may have an impedance far exceeding the capacitor's impedance at signal frequencies.

For example, wires in a low voltage rack arrangement are typically spaced 20 centimeters (cm) apart, and a 10 AWG wire of that length has an inductance of 0.21 microhenry (uH) or nearly 40 ohms at 30 megahertz (MHz). Should the capacitive coupler need to connect to a non-adjacent wire, the impedance could increase to 80 or 120 ohms. As a typical capacitive coupler must be fused, and a fuse impedance is added in series, a total series inductive impedance can be significant in comparison to a typical modem's 50 ohm impedance.

SUMMARY OF THE INVENTION

There is provided an arrangement of components for coupling data between a power line and a communication device. The arrangement includes an inductive coupler that employs a power line conductor as a primary winding, a capacitor connected across a secondary winding of the inductive coupler, the capacitor for creating a resonant circuit with the secondary winding at a frequency within a desired frequency band, and an impedance matching transformer for connecting a communications device to the secondary winding. The resonant circuit has a loaded Q consistent with the desired bandwidth.

An alternative arrangement includes a capacitor in series with a conductive cylinder between the power line and the communication device, where the capacitor is for blocking power line voltage while passing a signal between the power line and the communication device, and the conductive cylinder appears as a low inductance to the signal.

DESCRIPTION OF THE INVENTION

A low frequency inductive coupler in accordance with the present invention extends cutoff frequency downwards, to a lower frequency, without resorting to an addition of heavy magnetic cores. The inductive coupler is clamped around an energized power line conductor of the power line. Assume that the power line conductor passing through a core of the coupler serves as a primary winding for the inductive coupler. Since the coupler is clamped around the power line conductor, and since the power line conductor serves as a primary winding, the coupler has only a one-turn primary winding. The physical dimensions of the power line conductor typically require that the core be large with a long magnetic circuit path. An air gap may be required to prevent saturation of the core. Both of these factors reduce the inductance of the coupler.

A classic method of reducing reactive loading in a circuit is to resonate an offending reactance with an opposite reactance. In the case of an inductive coupler with a shunt inductance, a shunt capacitor may be connected across a secondary coil of the inductive coupler to neutralize magnetization inductance.

In the case of a broadband modem, such as those using spread spectrum, the resonance is likely to be too sharp, and thus is effective over too narrow a sub-band. As described herein, an impedance matching transformer is connected between the coupler and a modem so as to adjust the modem's impedance, as reflected across the coupler circuit, to provide a low enough loaded Q as to increase bandwidth so as to be similar to a width of the modem frequency band.

Figure 2:
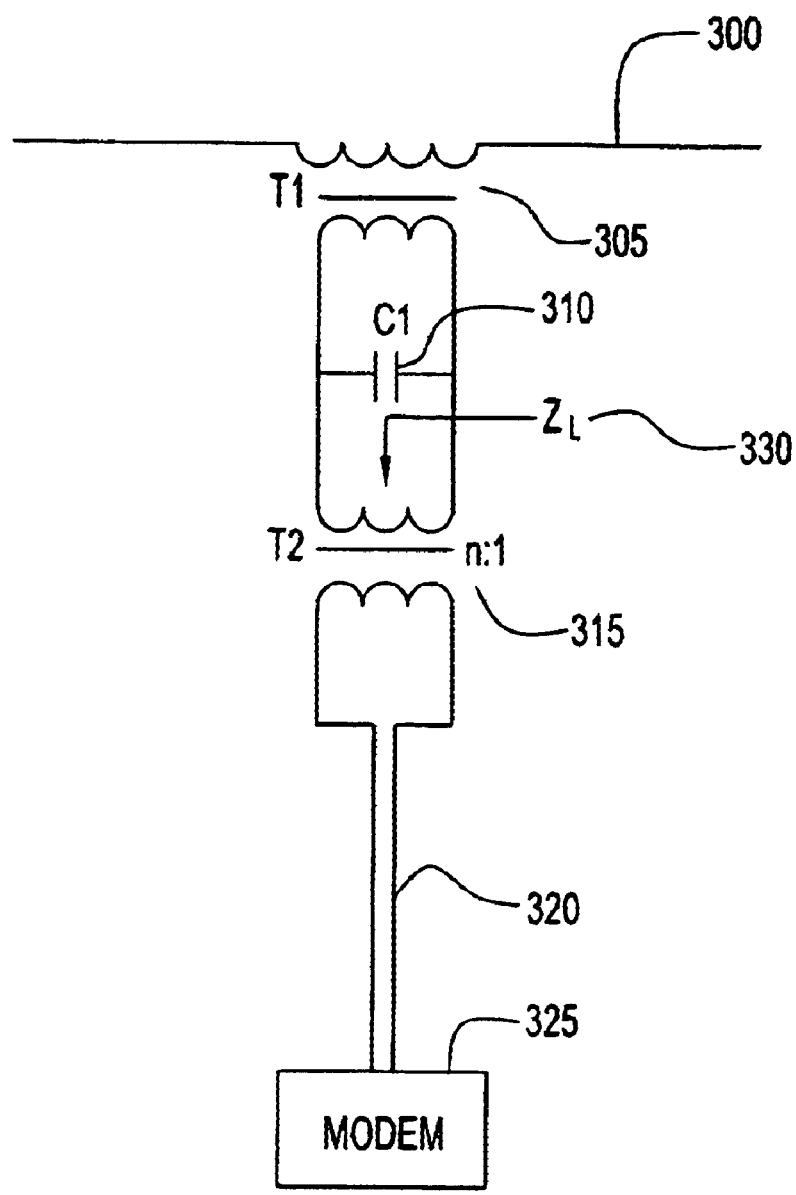
FIG. 2 is a schematic of an impedance matching circuit for an inductive coupler.

FIG. 2 shows an impedance-matching circuit through which a modem 325 is connected to an inductive coupler 305. A power line 300 passes through a core of inductive coupler 305. A signal transformer 315, with turns ratio n:1, improves impedance matching between inductive coupler 305 and modem 325. The combination of inductive coupler 305 and signal transformer 315 can provide a very wide bandpass, but the low frequency response of the combination will be limited to that determined by a magnetization inductance of inductive coupler 305 and an impedance 330 that is reflected from modem 325.

Capacitor 310 resonates the magnetization inductance and provides a frequency band around the resonant frequency where a loading effect of the magnetization inductance is reduced, and signal attenuation across inductive coupler 305 is reduced. The effect of capacitor 310 is to lower the cutoff frequency of inductive coupler 305, allowing inductive coupler 305 to operate at a lower frequency than would otherwise be possible with a given level of magnetization inductance.

There is thus provided a method for configuring an inductive coupler to a communication device. The method includes connecting a capacitor across a secondary winding of the inductive coupler for creating a resonant circuit with the secondary winding at a frequency within a desired frequency band, and connecting the communications device to the secondary winding via an impedance matching transformer. The resonant circuit has a loaded Q consistent with the desired bandwidth.

Figure 1:
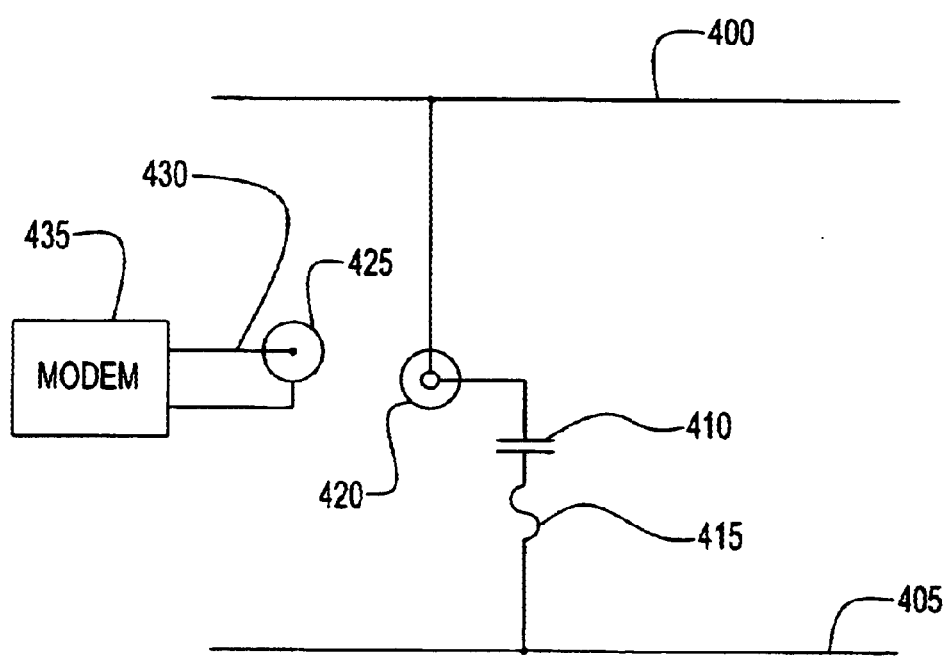
FIG. 1 is a schematic of a prior art capacitive coupler.
Figure 3:
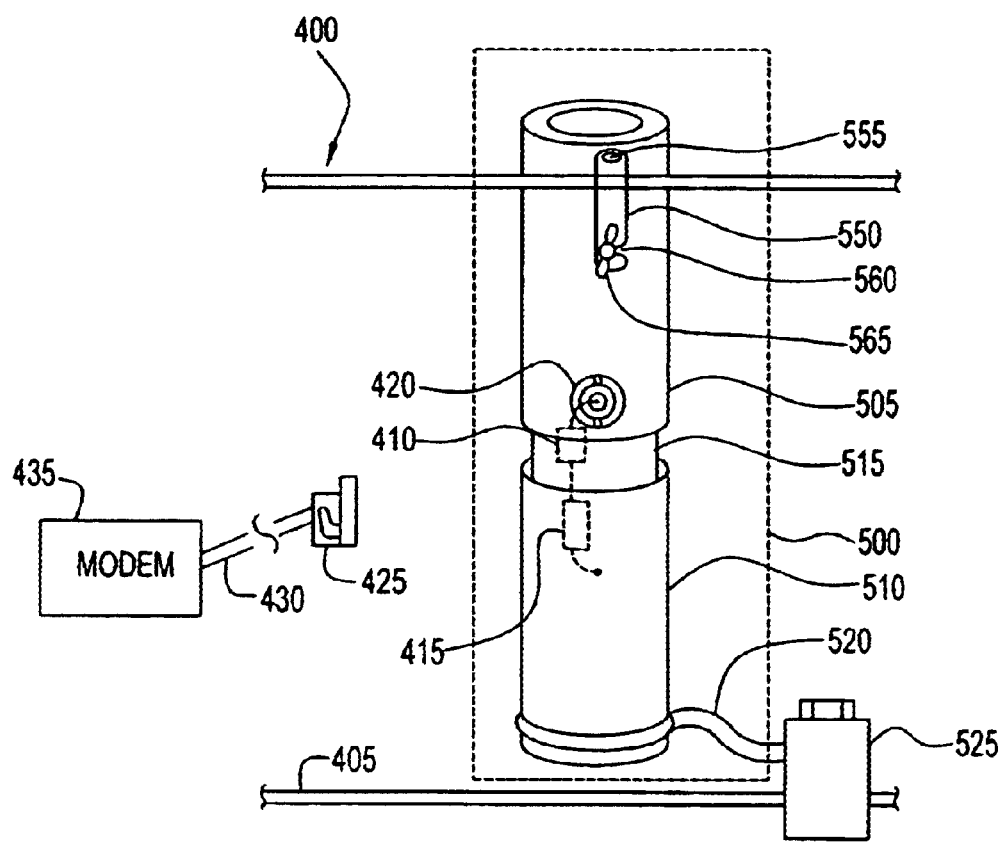
FIG. 3 illustrates a circuit with a capacitive coupler using low-inductance leads.

FIG. 3 is an illustration of a physical implementation of a capacitive coupler 500. Power lines 400 and 405, capacitor 410, fuse 415 and connector 420 retain the same identification as in FIG. 1. Also as in FIG. 1, modem 435 is connected, via cable 430 and connector 425, to connector 420. Electrically conductive cylinder sections 505 and 510 each have a diameter in the range of 1 to 3 cm, which is many times larger than diameters of wires, and thus provide connections to power lines 400 and 405 with negligible inductance. Conductive cylinder sections 505 and 510 and an insulating cylinder segment 515 form a mechanically rigid body, which may have a common axis.

Power line 400, i.e., a neutral line, is usually bare, otherwise, a few cm of its insulation needs to be removed. One end of capacitive coupler 500 is electrically connected to, and physically supported by, power line 400. A bar 550 with a slot 560 and a wing nut 565 provide a mechanism for tightening section 505 onto power line 400.

The other end of capacitive coupler 500 is electrically connected to power line 405 by a wire 520 and a clamp 525. Wire 520 is soldered or brazed to conductive cylinder section 510, and has sufficient stiffness and strength to support capacitive coupler 500 on power line 405, should upper support provided by the combination of bar 550, slot 560 and wing nut 565, or wire 400, fail. Clamp 525 is a standard clamp, commonly available to utility linemen.

Figure 4:
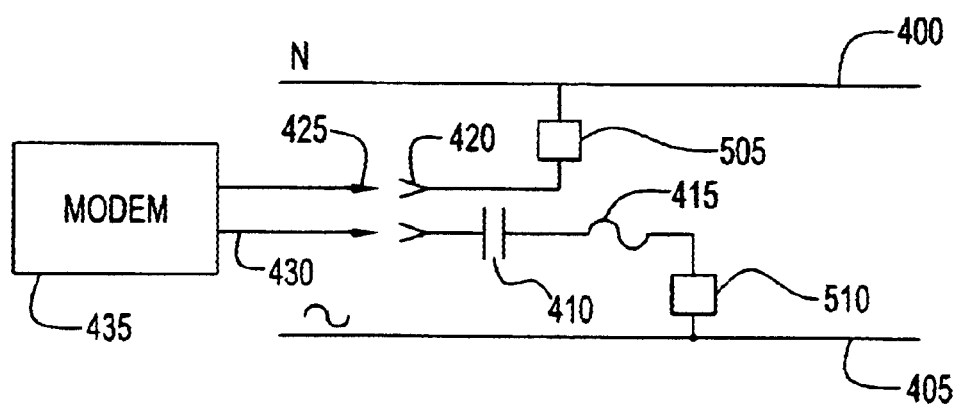
FIG. 4 is a schematic diagram of the circuit shown in FIG. 3.

FIG. 4 is a schematic diagram of the arrangement shown in FIG. 3. Cable 430, connectors 425 and 420, capacitor 410, fuse 415, and conductors 505 and 510 provide a signal path between modem 435 and power lines 400 and 405. Because of their relatively large diameters, conductive cylinder sections 505 and 510 exhibit inductances that are negligible in comparison to the impedance of modem 435 and capacitor 410, thus reducing coupling loss.

There is thus provided a method for coupling data between a power line and a communication device. The method includes installing a capacitor in series with a conductive cylinder between the power line and the communication device. The capacitor is for blocking power line voltage while passing a signal between the power line and the communication device, and the conductive cylinder appears as a low inductance to the signal. Additionally, the method may include installing a high interruption current fuse in series with the capacitor.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. A method for configuring components for power line communications, comprising:

installing an inductive coupler that employs a power line conductor as a primary winding;

connecting a capacitor across a secondary winding of said inductive coupler for creating a resonant circuit with said secondary winding at a frequency within a desired frequency band; and connecting a communications device to said secondary winding via an impedance matching transformer, wherein said resonant circuit has a loaded Q consistent with said desired bandwidth.

2. A method for coupling data between a power line and a communication device, comprising:

installing a capacitor in series with a conductive cylinder between said power line and said communication device, wherein said capacitor is for blocking power line voltage while passing a signal between said power line and said communication device, and wherein said conductive cylinder appears as a low inductance to said signal.

3. The method of claim 2, further comprising installing a high interruption current fuse in series with said capacitor.

4. An arrangement of components for coupling data between a power line and a communication device, comprising:

an inductive coupler that employs a power line conductor as a primary winding;

a capacitor connected across a secondary winding of said inductive coupler for creating a resonant circuit with said secondary winding at a frequency within a desired frequency band; and an impedance matching transformer for connecting a communications device to said secondary winding, wherein said resonant circuit has a loaded Q consistent with said desired bandwidth.

5. An arrangement of components for coupling data between a power line and a communication device, comprising:

a capacitor in series with a conductive cylinder between said power line and said communication device, wherein said capacitor is for blocking power line voltage while passing a signal between said power line and said communication device, and wherein said conductive cylinder appears as a low inductance to said signal.

6. The arrangement of claim 5, further comprising a high interruption current fuse in series with said capacitor.

* * * * *